(12) United States Patent
Dai et al.

(10) Patent No.: US 9,159,805 B2
(45) Date of Patent: Oct. 13, 2015

(54) TFT ARRAY SUBSTRATE AND A METHOD FOR MANUFACTURING THE SAME GRAPHENE BASED DISPLAY DEVICE

(71) Applicant: BOE TECHNOLOGY GROUP CO., LTD., Beijing (CN)

(72) Inventors: Tianming Dai, Beijing (CN); Jianshe Xue, Beijing (CN); Qi Yao, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/704,704

(22) PCT Filed: Sep. 28, 2012

(86) PCT No.: PCT/CN2012/082245
§ 371 (c)(1),
(2) Date: Dec. 17, 2012

(87) PCT Pub. No.: WO2013/044836
PCT Pub. Date: Apr. 4, 2013

(65) Prior Publication Data
US 2014/0077160 A1    Mar. 20, 2014

(30) Foreign Application Priority Data

Sep. 29, 2011   (CN) .......................... 2011 1 0294074

(51) Int. Cl.
*H01L 29/04* (2006.01)
*H01L 29/10* (2006.01)
(Continued)

(52) U.S. Cl.
CPC ........ *H01L 29/66742* (2013.01); *H01L 27/124* (2013.01); *H01L 27/3262* (2013.01); *H01L 29/1606* (2013.01); *H01L 29/78684* (2013.01); *G02F 1/1368* (2013.01)

(58) Field of Classification Search
CPC ..................... H01L 29/1606; H01L 29/66439; H01L 27/1214; H01L 27/3262; H01L 27/786

USPC ................ 257/59, 64, 72, E21.041, E29.273; 977/734
See application file for complete search history.

(56) References Cited

U.S. PATENT DOCUMENTS 7,130,010 B2 * 10/2006 Jeoung .......................... 349/141
8,330,194 B2 * 12/2012 Sato .............................. 257/291
(Continued)

FOREIGN PATENT DOCUMENTS

CN    101897009 A    11/2010
CN    102024846 A    4/2011
(Continued)

OTHER PUBLICATIONS

International Search Report mailed Jan. 3, 2013; PCT/CN2012/082245.
(Continued)

*Primary Examiner* — Jesse Y Miyoshi
(74) *Attorney, Agent, or Firm* — Ladas & Parry LLP

(57) ABSTRACT

Embodiments of the present invention provide a thin film transistor (TFT) array substrate and a method for manufacturing the same and a display device. The TFT array substrate improves a structure of a TFT array substrate and has a small thickness, and process flow is simplified. The method for manufacturing a thin film transistor (TFT) array substrate comprises: obtaining a gate line and a gate electrode through a first patterning process on a glass substrate; forming a gate insulating layer on the gate line and the gate electrode; forming a graphene layer on the gate insulating layer, and obtaining a semiconductor active layer over the gate electrode by a second patterning process and a hydrogenation treatment; obtaining a data line, a source electrode, a drain electrode and a pixel electrode which are located on the same layer by a third patterning process; and forming a protection layer on the data line, the source electrode, the semiconductor active layer, the drain electrode and the pixel electrode.

3 Claims, 3 Drawing Sheets

(51) Int. Cl.
*H01L 29/66* (2006.01)
*H01L 27/32* (2006.01)
*H01L 29/16* (2006.01)
*H01L 29/786* (2006.01)
*H01L 27/12* (2006.01)
*G02F 1/1368* (2006.01)

(56) References Cited

U.S. PATENT DOCUMENTS

| | | | |
|---|---|---|---|
| 8,426,309 B2 * | 4/2013 | Ward et al. | 438/672 |
| 8,513,653 B2 * | 8/2013 | Woo et al. | 257/40 |
| 8,519,406 B2 * | 8/2013 | Yoon et al. | 257/72 |
| 8,558,960 B2 * | 10/2013 | Yamazaki et al. | 349/43 |
| 2009/0032804 A1 | 2/2009 | Kalburge | |
| 2011/0057168 A1 | 3/2011 | Kobayashi | |
| 2011/0069090 A1 | 3/2011 | Lee et al. | |
| 2011/0084252 A1 | 4/2011 | Wu et al. | |
| 2011/0180803 A1 | 7/2011 | Kim et al. | |
| 2011/0269629 A1 * | 11/2011 | Giustino et al. | 505/100 |

FOREIGN PATENT DOCUMENTS

| | | |
|---|---|---|
| CN | 20110045252 A | 5/2011 |
| CN | 1012136499 A | 7/2011 |
| CN | 102629577 A | 8/2012 |

OTHER PUBLICATIONS

First Chinese Office Action dated Jul. 31, 2013; Appln. No. 201110294074.7.
State Intellectual Property Office of P.R. China Notification to Grant the Patent Right; mailed Sep. 24, 2013; Appln. No. 201110294074.7.

* cited by examiner

TFT ARRAY SUBSTRATE AND A METHOD FOR MANUFACTURING THE SAME GRAPHENE BASED DISPLAY DEVICE

TECHNICAL FIELD

Embodiments of the present invention relate to a TFT array substrate and a method for manufacturing the same and a display device.

BACKGROUND

For a thin film transistor-liquid crystal display (TFT-LCD), the degree of rotation of liquid crystal molecules are varied with variance in the electric field intensity applied to a liquid crystal layer, so that the level of light permeability is controlled to display an image. Generally, a liquid crystal display panel comprises a backlight module assembly, a polarizer, an upper substrate (usually a color filter substrate), a lower substrate (usually an array substrate), and a liquid crystal molecule layer filled in a liquid crystal cell formed with these two substrates. Data lines and gate lines, which intersect each other laterally and longitudinally, are formed on the array substrate, and the data lines and the gate lines surround and define pixel units which are arranged in a matrix. Each of the pixel units comprises a TFT switch element and a pixel electrode. The TFT switch element comprises a gate electrode, a source electrode, a drain electrode and an active layer; the gate electrode is connected to a gate line, the source electrode is connected to a data line, the drain electrode is connected to the gate electrode, and the active layer is formed between the source and drain electrodes and the gate electrode. A common electrode may be further formed on the substrate and acts to form an electric field together with the pixel electrode, and degree of rotation of liquid crystal molecules are controlled by variance in electric field intensity between the common electrode and the pixel electrode. A storage capacitor may be further formed between a storage capacitor line on the TFT array substrate, which is parallel to and located in the same layer as the gate lines, and the pixel electrode and acts to maintain states of the liquid crystal molecules before the next signal arrives.

In an advanced super dimension switch (ADS) technology, a multi-dimensional electric field is formed by an electric field produced at edges of slit electrodes on the same plane and an electric field produced between a layer of the slit electrodes and a layer of a plate-like electrode, so as to allow liquid crystal molecules in all orientations in a liquid crystal cell, which are located directly above the electrode and between the slit electrodes, to be rotated, thereby enhancing the work efficiency of liquid crystals and increasing the transmissive efficiency. The Advanced Super Dimensional Switch technology can improve the picture quality of TFT-LCD products, and has advantages of high resolution, high transmittance, low power consumption, wide viewing angle, high aperture ratio, low chromatic aberration, push Mura-free, and etc.

In the course of manufacturing a TFT array substrate of an ADS mode, production of a pixel electrode layer, a source electrode, a drain electrode and an active layer is usually conducted in a layered manner. Thus, not only thickness of the substrate is increased, but the process flow is cumbersome.

SUMMARY

Embodiments of the present invention provide a TFT array substrate and a method for manufacturing the same, and a display device, improving the structure of the TFT array substrate, thinning thickness of the substrate, and simplifying the process flow.

According to an aspect of the invention, there is provided a method for manufacturing a thin film transistor (TFT) array substrate, comprising:

obtaining a gate line and a gate electrode on a base substrate through a first patterning process;

forming a gate insulating layer on the gate line and the gate electrode;

forming a graphene layer on the gate insulating layer, and obtaining a semiconductor active layer formed of graphene by a second patterning process and a hydrogenation treatment over the gate electrode;

obtaining a data line, a source electrode, a drain electrode and a pixel electrode, which are formed of grapheme, by a third patterning process on the graphene layer; wherein the source electrode contacts with the semiconductor active layer and the drain electrode contacts with the semiconductor active layer so as to define a TFT channel, and the pixel electrode contacts with the drain electrode; and forming a protection layer on the data line, the source electrode, the semiconductor active layer, the drain electrode and the pixel electrode.

In an example, on the protection layer and over the pixel electrode, a common electrode is formed.

According to another aspect of the invention, there is provided a TFT array substrate, comprising:

a base substrate;

a gate line and a gate electrode which are formed on the base substrate;

a gate insulating layer formed on the gate line and the gate electrode;

a data line, a source electrode, a semiconductor active layer, a drain electrode and a pixel electrode, which are formed of graphene and formed on the insulating layer; wherein the source electrode contacts with the semiconductor active layer, and the drain electrode contacts with the semiconductor active layer, so as to define a TFT channel, and the pixel electrode contacts with the drain electrode; and a protection layer formed on the data line, the source electrode, the semiconductor active layer, the drain electrode and the pixel electrode.

In an example, on the protection layer and over the pixel electrode, a common electrode layer is formed.

According to still another aspect of the invention, there is provided a display device, comprising the above TFT array substrate.

The TFT array substrate and a method for manufacturing the same and the display device, which are provided by embodiments of the invention, employ a graphene material to produce the data line, the source electrode, the drain electrode, the active layer and the pixel electrode layer of the TFT substrate in the same layer on the gate insulating layer, whereby as compared to a method of production in different layers, thickness of the TFT array substrate becomes thinner, and the process flow is simplified.

BRIEF DESCRIPTION OF THE DRAWINGS

To illustrate technical solutions in embodiments of the present invention more clearly, accompanied drawings of the embodiments will be briefly introduced below. Obviously, the accompanied drawings described below merely relate to some embodiments of the present invention, and are not limitation on the present invention.

DETAILED DESCRIPTION

In order to make objects, technical details and advantages of the embodiments of the invention apparent, hereinafter, technical solutions in embodiments of the present invention will be clearly and fully described in combination with the accompanied drawings in the embodiments of the present invention. Apparently, the embodiments to be described are merely a part but not all of embodiments of the present invention. Every other embodiment as would be obvious to those ordinarily skilled in the art without creative work, comes within the protection scope of the present invention.

An array substrate according to an embodiment of the invention comprises a plurality of gate lines and a plurality of data lines, these gate lines and data lines intersect each other to thereby define pixel units arranged in a matrix form, and each of the pixel units comprises a thin film transistor functioning as a switch element and a pixel electrode. For example, for the thin film transistor of each pixel, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. The following description is made mainly with reference to a single unit or a plurality of pixel units, but other pixel units can be formed in the same way.

A method for manufacturing a TFT array substrate, which is provided by an embodiment of the invention, comprises the following steps.

S101, a metal layer is deposited on a base substrate, and a gate line and a gate electrode are obtained by a first patterning process.

Figure 1:
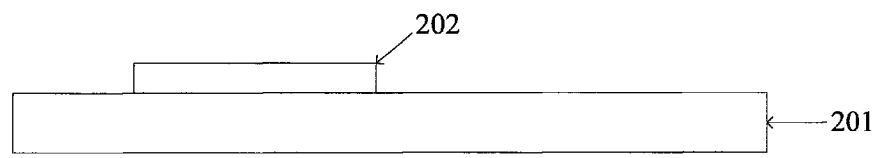
FIG. 1 is a schematic view 1 illustrating a substrate structure in the course of a method for manufacturing a TFT array substrate, provided by an embodiment of the invention.

As shown in FIG. 1, for example, a magnetron sputtering method can be used to produce a metal thin-film layer with a thickness of for example 1000 Å to 7000 Å on a base substrate 201. A metal of molybdenum, aluminum, aluminum nickel alloy, molybdenum tungsten alloy, chromium, copper or the like may be used as the material for the metal thin-film layer, and a stack structure of thin films of aforementioned materials may also be used. Then, through a first patterning process with a mask comprising an exposure, development, etching, removing and so on, a plurality of lateral gate lines (not shown in FIG. 1) and gate electrodes 202 connected to the gate lines are formed on a certain region of the glass substrate 201.

S102, a gate insulating layer is formed on the gate line and the gate electrode.

Figure 2:
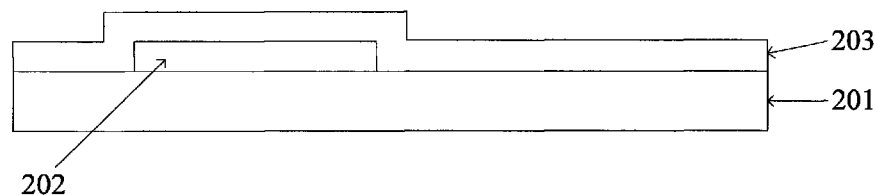
FIG. 2 is a schematic view 2 illustrating a substrate structure in the course of the method for manufacturing the TFT array substrate, provided by the embodiment of the invention.

As shown in FIG. 2, for example, a plasma enhanced chemical vapor deposition (PECVD) method can be used to deposit a gate insulating layer 203 with a thickness of for example 1000 Å to 6000 Å on the gate lines and the gate electrodes 202, and the material for the gate insulating layer 203 is usually silicon nitride, and an insulating material such as silicon oxide, silicon oxynitride and so on may also be used.

S103, a graphene layer is formed on the gate insulating layer, and through a second patterning process and a hydrogenation treatment, a semiconductor active layer formed of graphene is obtained over the gate electrode.

Figure 3:
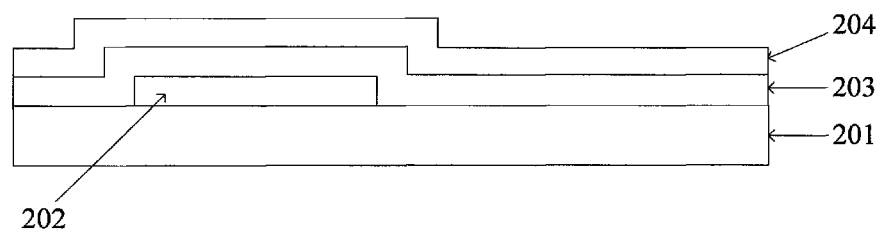
FIG. 3 is a schematic view 3 illustrating a substrate structure in the course of the method for manufacturing the TFT array substrate, provided by the embodiment of the invention.

Firstly, as shown in FIG. 3, for example, a layer of graphene material is deposited on the gate insulating layer 203 by means of PECVD, or a water-soluble, single-layered or multi-layered graphene material is spin-coated, so as to form a graphene layer 204.

Figure 4:
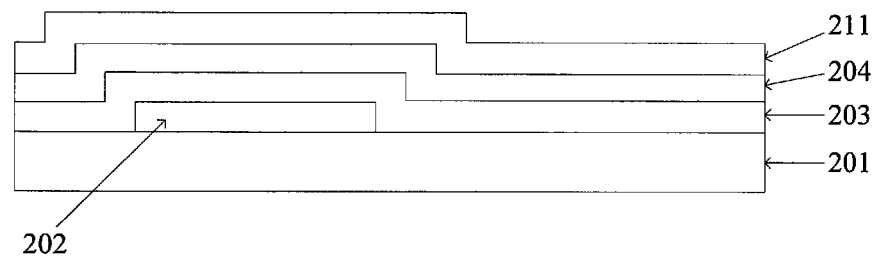
FIG. 4 is a schematic view 4 illustrating a substrate structure in the course of the method for manufacturing the TFT array substrate, provided by the embodiment of the invention.

Next, as shown in FIG. 4, a layer of photoresist 211 is coated on the graphene layer 204.

Figure 5:
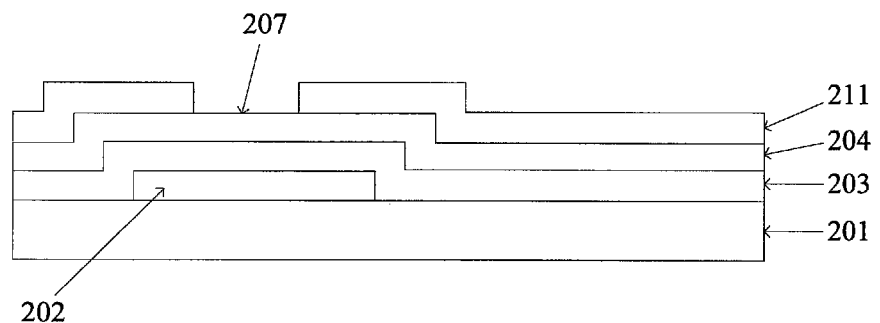
FIG. 5 is a schematic view 5 illustrating a substrate structure in the course of the method for manufacturing the TFT array substrate, provided by the embodiment of the invention.

Subsequently, after exposure and development, a channel-region graphene 207 is exposed, as shown in FIG. 5. Furthermore, for example, a hydrogenation treatment is performed on the channel-region graphene 207 by using $H_2$ or a mixed gas of $H_2$ and Ar gas, so as to attain a semiconductor active layer 207 over the gate electrodes 202.

It should be noted that, graphene has a characteristic of zero-forbidden band, and the average freedom distance and the coherence length of carriers in graphene can reach a micrometer level even at the room temperature. Meanwhile, graphene has carrier mobility far higher than silicon, and thus it is a semiconductor material of excellent properties.

Figure 6:
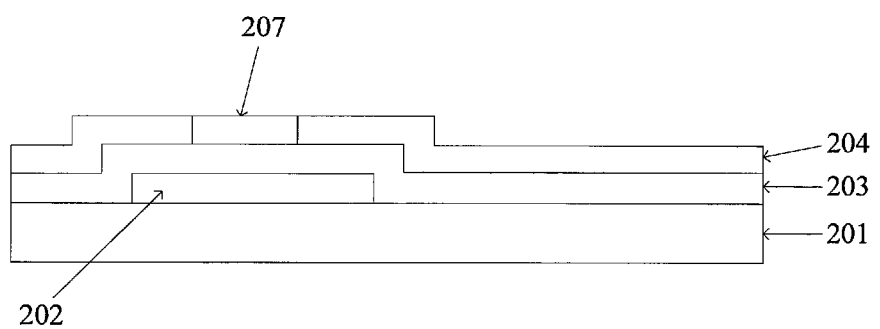
FIG. 6 is a schematic view 6 illustrating a substrate structure in the course of the method for manufacturing the TFT array substrate, provided by the embodiment of the invention.

Finally, the remaining photoresist is removed, as shown in FIG. 6.

S104, a data line, a source electrode, a drain electrode and a pixel electrode, which are formed of graphene, are obtained on the graphene layer through a third patterning process; the source electrode contacts with the semiconductor active layer and the drain electrode contacts with the semiconductor active layer so as to define a TFT channel, and the pixel electrode contacts with the drain electrode.

Figure 7:
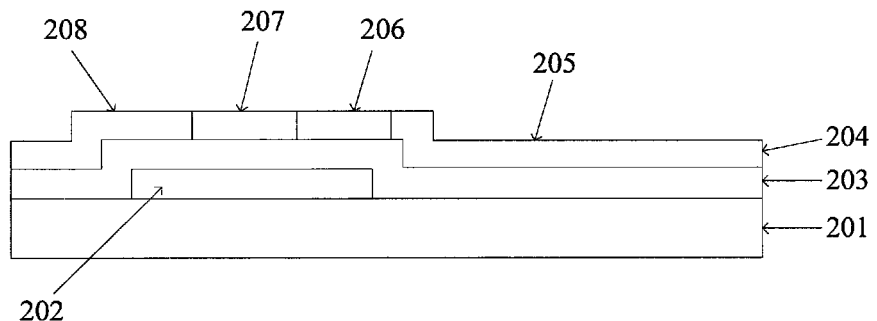
FIG. 7 is a schematic view 7 illustrating a substrate structure in the course of the method for manufacturing the TFT array substrate, provided by the embodiment of the invention.

As shown in FIG. 7, a photoresist is again coated on the graphene layer 204, and after exposure, development, etching and removing, a data line (not shown in FIG. 7), a source electrode 208, a drain electrode 206 and a pixel electrode 205, which are formed of graphene, are obtained. The source electrode 208 contacts with the semiconductor active layer 207 and the drain electrode 206 contacts with the semiconductor active layer 207 so as to define a TFT channel, and the pixel electrode 205 contacts with the drain electrode 206. Here, a width of the semiconductor active layer 207 needs to be smaller than a width of the gate electrode 202, so that the contacting region of the source electrode 208 with the semiconductor active layer 207 and the contacting regions of the drain electrode 206 with the semiconductor active layer 207 for defining the TFT channel are both located over the gate electrode 202.

Up to here, the data line, the source electrode, the semiconductor active layer, the drain electrode, and the pixel electrode in the embodiment of the invention is located in the same layer, whereby it is possible for the thickness of the array substrate to become thinner, and as compared to an existing layered production, processes are reduced.

Because graphene is a two-dimensional material, its characteristics fall between semiconductor and conductor. When it is in an intrinsic state, due to overlap between energy bands, the conductivity of graphene resembles metallic characteristic and its conductivity can reach 20000 $cm^2/V \cdot S$, and therefore it can function as a material for source and drain electrodes of a TFT. When it is treated with hydrogen gas or argon gas, or a mixed gas of them, hydrogenated graphene with an increased relative bandgap is generated and can function as a semiconductor material. Further compared with a general semiconductor material, this semiconductor material has higher carrier mobility.

S105, a protection layer is formed on the data line, the source electrode, the semiconductor active layer, the drain electrode and the pixel electrode.

Figure 8:
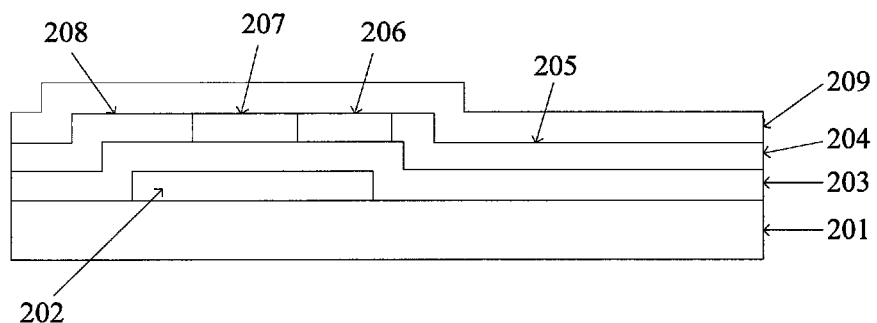
FIG. 8 is a schematic view 8 illustrating a substrate structure in the course of the method for manufacturing the TFT array substrate, provided by the embodiment of the invention.

As shown in FIG. 8, a protection layer 209 with a thickness of for example 1000 Å to 6000 Å is coated on the data line, the sources electrode 208, the semiconductor active layer 207, the drain electrode 206 and the pixel electrode 205, and its material is usually silicon dioxide, a transparent, organic resin material or other oxide.

Accordingly, a TFT array substrate is obtained here. The above pixel electrode is controlled by a thin film transistor functioning as a switch element for display.

In an example, the TFT array substrate is for example an array substrate for an ADS mode liquid crystal display device. Accordingly, a common electrode is further formed on the protection layer.

S106, on the protection layer and over the pixel electrode, a common electrode is formed.

Figure 9:
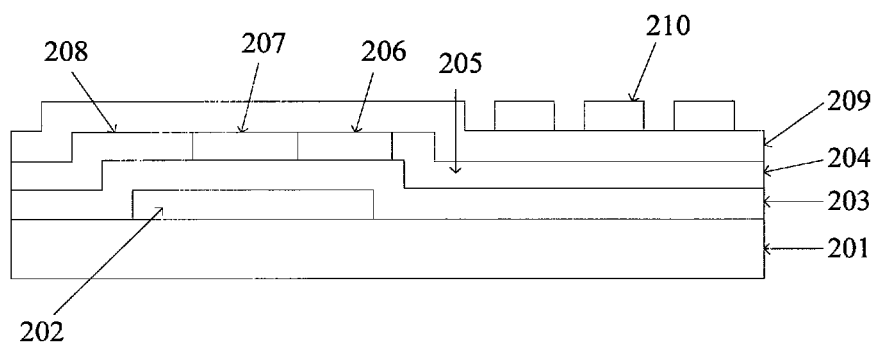
FIG. 9 is a schematic view 9 illustrating a substrate structure in the course of the method for manufacturing the TFT array substrate, provided by the embodiment of the invention.

As shown in FIG. 9, a layer of indium tin oxide (ITO) or graphene with a thickness between 100 Å and 1000 Å is deposited on the protection layer 209. Then, a layer of photoresist is coated on the deposited ITO or graphene, and after a patterning process comprising exposure, development, etching, removing and so on, a common electrode 210 located over the pixel electrodes 205 is attained.

The common electrode 210 may include a plurality of slits (not shown), and acts to generate a horizontal electric field in cooperation with the pixel electrode 205 after a voltage difference is applied therebetween, and the electric field is used for driving liquid crystals to rotate.

In another example, the TFT array substrate is for example an array substrate for a vertical aligned (VA) mode liquid crystal display device. Accordingly, pixel electrodes on the array substrate act to coordinate with a common electrode on an opposed substrate in opposition to the array substrate to generate a vertical electric field, and the electric field is used for driving liquid crystals to rotate.

The TFT array substrate and a method for manufacturing the same, which are provided by the embodiments of the invention, employ a graphene material to produce the data line, the source electrode, the drain electrode, the active layer, and the pixel electrode layer in the same layer on the gate insulating layer, whereby, as compared to a method of production in a layered manner in prior art, the thickness of the TFT array substrate becomes thinner, and the process flow is simplified.

The TFT array substrate provided by the embodiment of the invention, as shown in FIG. 9, comprises: the base substrate 201; the gate line (not shown in the figure) and the gate electrode 202 formed on the substrate 201; the gate insulating layer 203 formed on the gate line and the gate electrode 202; and the data line (not shown in the figure), the source electrode 208, the semiconductor active layer 207, the drain electrode 206 and the pixel electrode 205, which are formed of graphene and formed on the gate insulating layer 203. The source electrode 208 contacts with the semiconductor active layer 207 and the drain electrode 206 contacts with the semiconductor active layer 207 so as to define a TFT channel, and the pixel electrode 205 contacts with the drain electrode 206. On the date line, the source electrode 208, the semiconductor active layer 207, the drain electrode 206 and the pixel electrode 205, there is formed a protection layer 209.

In an example, the TFT array substrate is for example an array substrate for an ADS mode liquid crystal display device. Accordingly, a common electrode is further formed on the protection layer. On the protection layer 209 and over the pixel electrode 205, a common electrode 210 is formed. The common electrode 210 may include a plurality of slits (not shown), and acts to generate a horizontal electric field in cooperation with the pixel electrodes 205 after a voltage difference is applied therebetween, and the electric field is used for driving liquid crystals to rotate.

In another example, the TFT array substrate is for example an array substrate for a vertical aligned (VA) mode liquid crystal display device. Accordingly, pixel electrodes on the array substrate act to coordinate with a common electrode on an opposed substrate in opposition to the array substrate to generate a vertical electric field, and the electric field is used for driving liquid crystals to rotate.

Graphene for the semiconductor active layer 207 is a graphene layer subject to a hydrogenation treatment. As graphene is a two-dimensional material, its characteristics fall between semiconductor and conductor. When it is in an intrinsic state, due to overlap of energy bands, its conductivity has a metallic characteristic and its conductivity can reach 20000 $cm^2/V \cdot S$, so it can function as a material for source and drain electrodes of a TFT. When it is treated with hydrogen gas or argon gas, or a mixed gas of them, a hydrogenated graphene with a relatively increased bandgap is generated and can function as a semiconductor material. Further compared to a general semiconductor material, this semiconductor material has higher carrier mobility.

In the embodiment, a width of the semiconductor active layer 207 may be smaller than a width of the gate electrode 202, so that the contacting region of the source electrode 208 with the semiconductor active layer 207 and the contacting region of the drain electrode 206 with the semiconductor active layer 207 for defining the TFT channel are both located over the gate electrode 202.

Further, the common electrode 210 in the embodiment may be formed of indium tin oxide or graphene.

In the embodiment, the data line, the source electrode, the semiconductor active layer, the drain electrode and the pixel electrode are located in the same layer, so that thickness of the TFT array substrate can become thinner, and as compared to the existing layered production, the producing process is simplified.

According to an embodiment of the invention, there is further provided a display device which employs the aforementioned TFT array substrate.

An example of the display device is a liquid crystal display device, in which, the TFT array substrate and an opposed substrate are disposed opposite to each other to form a liquid crystal cell, a liquid crystal material is filled in the liquid crystal cell. The opposed substrate is such as a color filter substrate. A pixel electrode of each pixel unit of the TFT array substrate acts to apply an electric field for controlling the degree of rotation of the liquid crystal material, to thereby conduct a display operation. In some examples, the liquid crystal display device further comprises a backlight source for providing backlight for the array substrate. The liquid crystal display device is for example a vertical aligned (VA) mode or an ADS mode liquid crystal display device.

Another example of the display device is an organic electroluminescent display device, in which, a pixel electrode of each pixel unit of the TFT array substrate functions as an anode or a cathode for driving an organic light-emitting material to emit light, to thereby conduct a display operation.

Still another example of the display device is an electronic paper display device, in which, a pixel electrode of each pixel unit of the TFT array substrate acts to control movement of charged fine particles in ink, and is used for display.

The display device according to embodiments of the invention can be applied to, such as televisions, cell phones, tablet computers, navigators, and so on.

For the display device in the embodiments, because the data line, the source electrode, the semiconductor active layer, the drain electrode and the pixel electrode in the TFT array substrate used by the display device are located on the same layer, thickness of the TFT array substrate can become thinner, which enable the display device to become thinner accordingly, and as compared to the existing layered production, the producing process is simplified.

The descriptions made above are merely the specific embodiments of the invention, but the protection scope of the invention is not limited thereto. All such variations or substitutions as would be obvious to those skilled in the technical field without departing from the technical scope disclosed by the present invention shall be embraced within the protection scope of the invention. Thus, the protection scope of the present invention shall be defined by the protection scope of the following claims.

The invention claimed is:

1. A method for manufacturing a thin film transistor (TFT) array substrate, comprising:

forming a metal layer on a base substrate, and obtaining a gate line and a gate electrode through a first patterning process;

forming a gate insulating layer on the gate line and the gate electrode;

forming a graphene layer on the gate insulating layer and obtaining a semiconductor active layer formed of graphene over the gate electrode by a second patterning process and a hydrogenation treatment;

obtaining a data line, a source electrode, a drain electrode and a pixel electrode, which are formed of graphene, by a third patterning process on the graphene layer; wherein the source electrode contacts with the semiconductor active layer and the drain electrode contacts with the semiconductor active layer so as to define a TFT channel, and the pixel electrode contacts with the drain electrode; and forming a protection layer on the data line, the source electrode, the semiconductor active layer, the drain electrode and the pixel electrode;

forming a common electrode on the protection layer and over the pixel electrode, wherein the data line, the source electrode, the semiconductor active layer, the drain electrode and the pixel electrode are located in a same layer, wherein forming of the graphene layer on the gate insulating layer and obtaining of the semiconductor active layer formed of graphene over the gate electrode by the second patterning process and the hydrogenation treatment comprises:

depositing a layer of graphene material by means of plasma enhanced chemical vapor deposition, or spin-coating a water-soluble, single layered or multi-layered graphene material, on the gate insulating layer, so as to form the graphene layer;

coating photoresist on the graphene layer, and exposing graphene in the channel region after exposure and development;

performing the hydrogenation treatment on graphene in the channel region by using $H_2$ or a mixed gas of $H_2$ and $Ar_2$; and removing the remaining photoresist, so as to obtain the semiconductor active layer formed of graphene over the gate electrode.

2. The method for manufacturing the TFT array substrate according to claim 1, wherein the common electrode is formed of indium tin oxide or graphene.

3. The method for manufacturing the TFT array substrate according to claim 1, wherein a width of the semiconductor active layer is smaller than a width of the gate electrode, so that a contacting region of the source electrode with the semiconductor active layer and a contacting region of the drain electrode with the semiconductor active layer for defining a TFT channel are both located over the gate electrode.

* * * * *

UNITED STATES PATENT AND TRADEMARK OFFICE
CERTIFICATE OF CORRECTION

PATENT NO. : 9,159,805 B2
APPLICATION NO. : 13/704704
DATED : October 13, 2015
INVENTOR(S) : Tianming Dai et al.

It is certified that error appears in the above-identified patent and that said Letters Patent is hereby corrected as shown below:

Title page, item (54), lines 1-3 - Correct the title to read:

"TFT ARRAY SUBSTRATE AND A METHOD FOR MANUFACTURING THE SAME AND GRAPHENE BASED DISPLAY DEVICE"

In the specification:

In column 1, lines 1-3, Correct the title to read:

"TFT ARRAY SUBSTRATE AND A METHOD FOR MANUFACTURING THE SAME AND GRAPHENE BASED DISPLAY DEVICE"

Signed and Sealed this
Twenty-third Day of August, 2016

Michelle K. Lee
*Director of the United States Patent and Trademark Office*